(12) United States Patent
Qin et al.

(10) Patent No.: US 8,164,194 B2
(45) Date of Patent: Apr. 24, 2012

(54) DATA LINE STRUCTURE IN LEAD REGION

(75) Inventors: Wei Qin, Beijing (CN); Wei Wang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 66 days.

(21) Appl. No.: 12/265,809

(22) Filed: Nov. 6, 2008

(65) Prior Publication Data
US 2009/0194883 A1 Aug. 6, 2009

(30) Foreign Application Priority Data
Feb. 4, 2008 (CN) .......................... 2008 1 0057693

(51) Int. Cl.
*H01L 23/48* (2006.01)

(52) U.S. Cl. .......... 257/773; 349/38; 257/751; 257/774; 438/648

(58) Field of Classification Search .................. 257/751, 257/773, 774; 438/648; 349/38
See application file for complete search history.

(56) References Cited

U.S. PATENT DOCUMENTS

| 6,531,392 B2 * | 3/2003 | Song et al. ..................... 438/648 |
| 2003/0197814 A1 | 10/2003 | Choi |
| 2005/0062046 A1 | 3/2005 | Kim et al. |
| 2006/0139502 A1 * | 6/2006 | Ahn et al. ....................... 349/38 |

FOREIGN PATENT DOCUMENTS
CN 1577025 A 2/2005
* cited by examiner

*Primary Examiner* — Fernando L Toledo
*Assistant Examiner* — Caleb Henry
(74) *Attorney, Agent, or Firm* — Ladas & Parry LLP

(57) ABSTRACT

An embodiment of the invention provides a data line structure in a lead region of a thin film transistor liquid crystal display (TFT-LCD). The data line structure in the lead region comprises a substrate and a gate layer data line segment, a dielectric layer, a data line lead, and a passivation layer, which are formed sequentially in the lead region on the substrate. The gate layer data line segment extends corresponding to the data line lead; the data line lead is formed with a via hole therein; a portion of the gate insulating layer and a portion of the passivation layer in a position corresponding to the via hole are removed so as to form a connection hole together with the via hole; a connection line segment is formed in the connection hole, and the gate layer data line segment and the data line lead are connected by the connection line segment in the connection hole.

8 Claims, 5 Drawing Sheets forming a gate layer and patterning the gate layer to form a gate layer data line segment

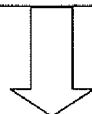

forming a source/drain electrode layer and patterning the source/drain electrode layer to form a data line lead and form a via hole in the data line lead

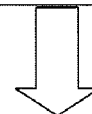

forming a gate insulating layer and an active layer subsequently and removing the active layer from the lead region

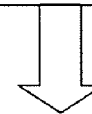

forming a passivation layer and removing the passivation layer and the gate insulating layer at the via hole to form a connection hole

forming a pixel electrode layer and patterning the pixel electrode layer to form a connection line segment in the connection hole

Fig. 8 forming a gate layer and patterning the gate layer to form a gate layer data line segment

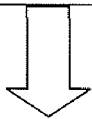

forming a gate insulating layer, an active layer and a source/drain electrode layer, patterning the active layer to form a data line lead and form a via hole in the data line lead, and removing the active layer at the via hole

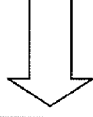

forming a passivation layer and removing the passivation layer and the gate insulating layer at the via hole to form a connection hole

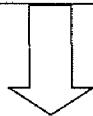

forming a pixel electrode layer and patterning the pixel electrode layer to form a connection line segment in the connection hole

Fig.9

DATA LINE STRUCTURE IN LEAD REGION

FIELD OF THE INVENTION

The present invention relates to a data line structure of a thin film transistor liquid crystal display (TFT-LCD) and a manufacturing method thereof, and in particular, to a data line structure in a lead region of a TFT-LCD and a manufacturing method thereof.

BACKGROUND OF THE INVENTION

A data line in the lead region fabricated through a five-mask (5MASK) process in a conventional TFT-LCD manufacturing process is shown in the plan view of FIG. 1 and the sectional view of FIG. 2. The 5MASK process can include the following steps of: (1) forming a gate layer on a substrate 7 and etching the gate layer; (2) forming a gate insulating layer 3 (e.g., a $SiN_x$ layer) and an active layer and etching the active layer; (3) forming a source/drain metal layer (S/D layer) and etching the source/drain metal layer in the lead region to form a data line lead 2; (4) forming a passivation layer 1 (e.g., a PVX layer); and (5) forming a pixel electrode layer and then etching the pixel electrode layer to remove it from the lead region. The region B as shown in FIG. 1 is an electrostatic discharging region, and the region C is a pin region for connection with another device.

A data line in the lead region fabricated by a four-mask (4MASK) process is also represented with FIGS. 1 and 2. The 4MASK process can include the following steps of: (1) forming a gate layer on a substrate 7 and then etching the gate layer; (2) forming a gate insulating layer 3, an active layer, and a source/drain metal layer, etching the source/drain metal layer in the lead region to form a data line lead 2; (3) forming a passivation layer 1; and (4) forming a pixel electrode layer and then etched the pixel layer to remove it from the lead region.

The two processes both provide a lead region structure that includes an insulating upper layer and an insulating bottom layer with a conductive wire therebetween. Particles on the substrate before and during deposition of the source/drain metal layer, electrostatic breakdown in the lead region, and breakage of the data line lead due to press in a subsequent process may all render the data line lead open, resulting in a bright line in a final product and degrading the quality of the product.

SUMMARY OF THE INVENTION

Embodiments of the present invention relate to a data line structure in a lead region of a TFT-LCD, which can prevent open lead due to electrostatic discharging (ESD) in the lead region, breakage by press, and the like, and a manufacturing method thereof.

An embodiment of the invention provides a data line structure in a lead region of a thin film transistor liquid crystal display (TFT-LCD). The data line structure in the lead region comprises a substrate and a gate layer data line segment, a dielectric layer, a data line lead, and a passivation layer, which are formed sequentially in the lead region on the substrate, wherein the gate layer data line segment extends corresponding to the data line lead; the data line lead is formed with a via hole therein; a portion of the dielectric layer and a portion of the passivation layer in a position corresponding to the via hole are removed so as to form a connection hole together with the via hole; a connection line segment is formed in the connection hole, and the gate layer data line segment and the data line lead are connected by the connection line segment in the connection hole.

Another embodiment of the invention provides a method of manufacturing a data line structure in a lead region of a thin film transistor liquid crystal display (TFT-LCD). The method comprises the steps of: (a) forming a gate layer on a substrate and patterning the gate layer to form a gate layer data line segment that corresponds to a data line lead to be formed in the lead region subsequently; (b) forming a dielectric layer on the gate layer date line segment on the substrate after step (a); (c) forming a source/drain metal layer on the substrate after step (b) and patterning the source/drain metal layer to form in the data line lead in the lead region and a via hole in the data line lead; (d) forming a passivation layer on the substrate after step (c) and patterning the passivation layer so as to remove a portion of the passivation layer and a portion of the dielectric layer at a position corresponding to the via hole to form a connection hole; and (e) forming a connection line segment that connects the gate layer data line segment and the data line lead in the connection hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more frilly understood from the detailed description given hereinafter and the accompanying drawings which are given by way of illustration only, and thus are not limitative of the present invention and wherein:

FIG. 8 is a flow chart of a third embodiment of a manufacturing method of a data line structure in the lead region of the TFT-LCD according to the invention.

FIG. 9 is a flow chart of a fourth embodiment of a manufacturing method of a data line structure in the lead region of the TFT-LCD according to the invention.

DESCRIPTION OF THE PREFERRED EMBODIMENTS

Hereinafter, the invention will be further described in detail with reference to the accompanying drawings and embodiments.

A first embodiment of a data line structure in a lead region of a TFT-LCD according to the invention is described below. As shown in the plan view of FIG. 3, the lead region described in the embodiment is in the peripheral portion of an array substrate of the TFT-LCD, and the data line lead 2 extends in the lead region. The structure of the lead region of the embodiment according to the invention will be further described with a sectional view of FIG. 4 taken along the line D-D in FIG. 3 and another sectional view of FIG. 5 taken along the line E-E in FIG. 3.

Figure 4:
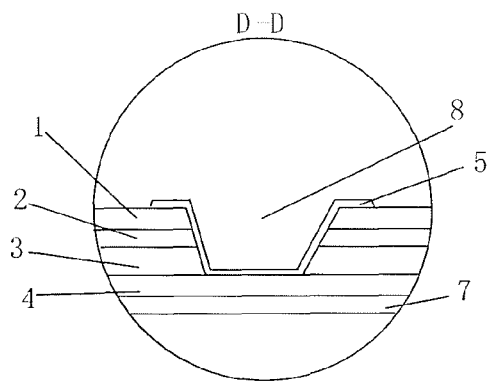
FIG. 4 is a sectional enlarged view taken along the line D-D in FIG. 3, which shows a first embodiment of the data line structure in the lead region of the TFT-LCD according to the invention.

As shown in FIG. 4, the lead region structure in the embodiment includes a substrate 7 and a gate insulating layer 3, a data line lead 2, a passivation layer 1, and a connection line segment 5 that are formed on the substrate 7. A gate layer data line segment 4 is formed below the data line lead 2 on the substrate 7. A via hole is formed in the data line lead 2, and a portion of the gate insulating 3 and a portion of the passivation layer 1 in the position corresponding to the via hole are removed so that a connection hole 8 is formed with the via hole in the data line lead 2. The connection line segment 5 is formed in the connection hole 8 and connects the gate layer data line segment 4 and the data line lead 2 in the connection hole 8. The gate layer data line segment 4 is formed below the data line lead 2 and extending along the date line lead 2. More preferably, the gate layer date line segment 4 may be formed right under the data line lead 2. The gate layer date line segment 4 can be connected to the data line lead 2 in the connection hole 8 conveniently. In addition, the gate layer date line segment 4 may be formed wider than the data line lead 2. There can be formed one or more via holes in the data line lead 2, and the via hole in the data line lead may be in various shapes, e.g., rectangular, circle, polygon, and the like. In this embodiment, the gate insulating layer 3 is a dielectric layer interposed between the gate layer date line segment 4 and the data line lead 2.

Figure 1:
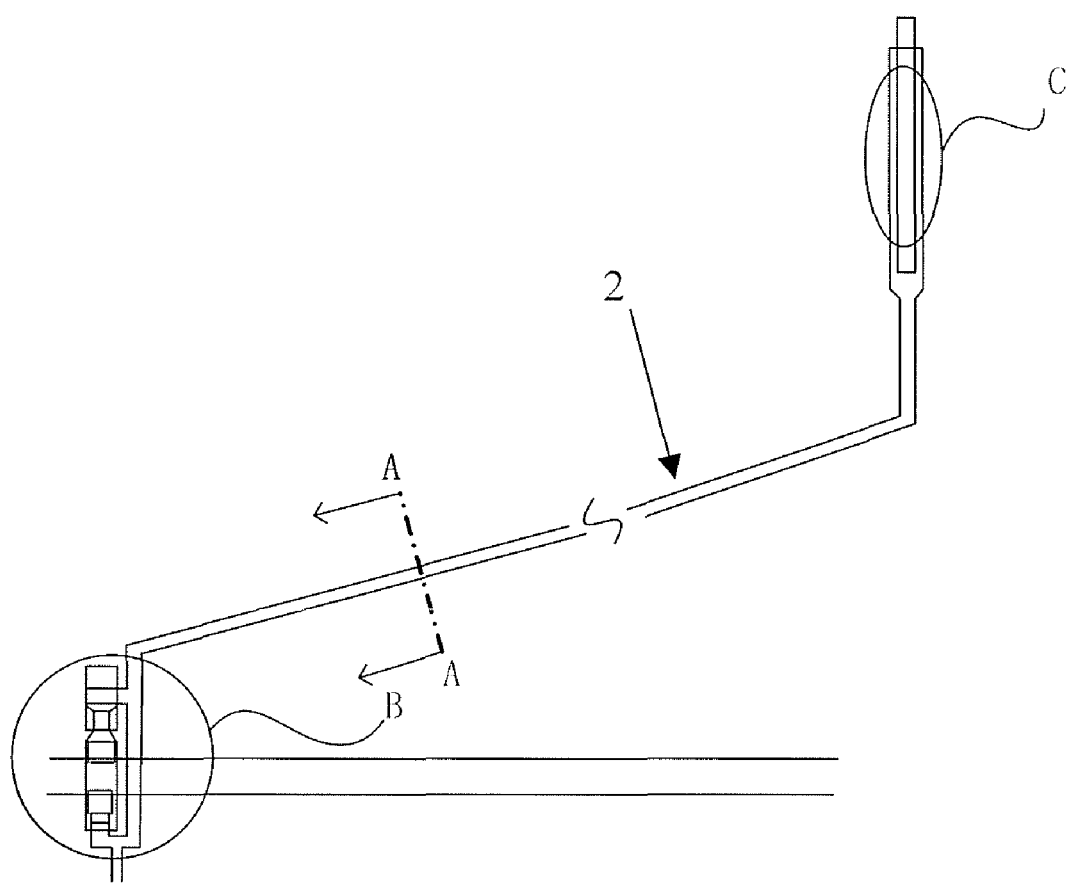
FIG. 1 is a plan view of a data line in a lead region of a conventional TFT-LCD.
Figure 2:
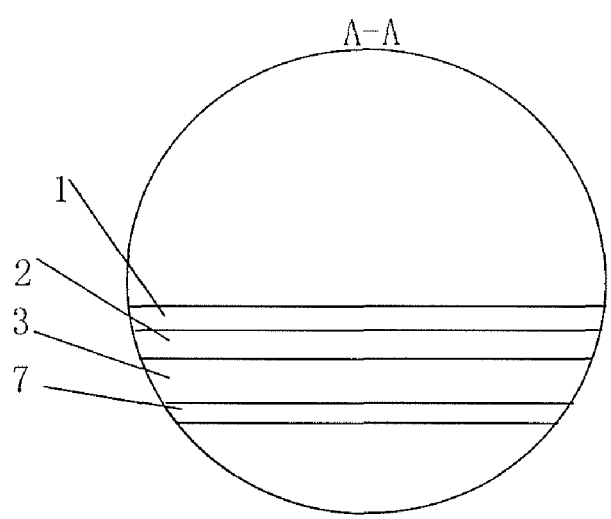
FIG. 2 is a sectional enlarged view taken along the line A-A in FIG. 1.
Figure 3:
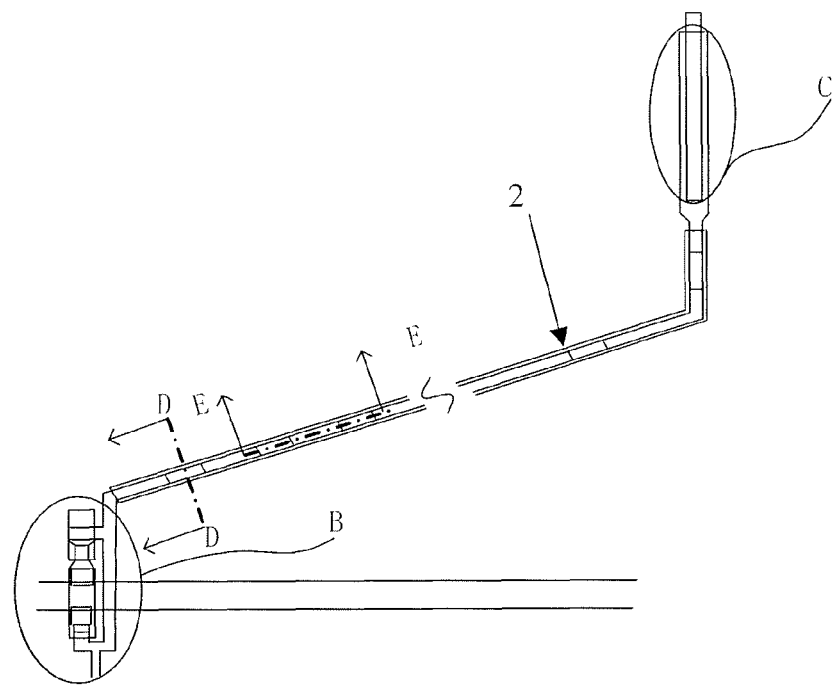
FIG. 3 is a plan view of a data line in a lead region of a TFT-LCD according to an embodiment of the invention.
Figure 5:
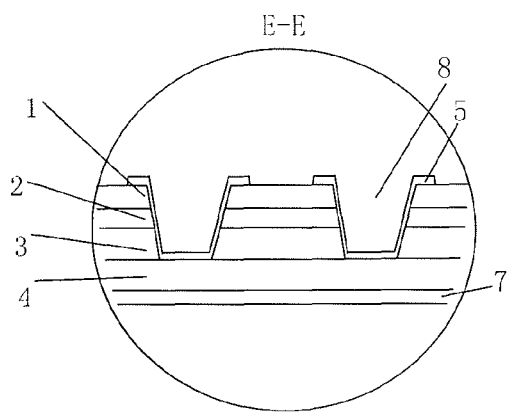
FIG. 5 is a sectional enlarged view taken along the line E-E in FIG. 3, which shows the first embodiment of the data line structure in the lead region of the TFT-LCD according to the invention.

FIG. 5 shows the sectional view taken along the line E-E in FIG. 3 of the lead region structure in the first embodiment. As viewed in the E-E direction, the lead region structure includes a plurality of via holes arranged separately in the data line lead, although only two via holes are shown in the figure. There may be one or more via holes in the data line lead 2, and the via holes may be a truncation type via hole in the above mentioned shapes, that is, the data line lead in the above embodiment may be in a segment configuration in which the segments of the data line lead are separated by the via holes.

A second embodiment of the data line structure in the lead region of a TFT-LCD according to the invention is described below.

Figure 6:
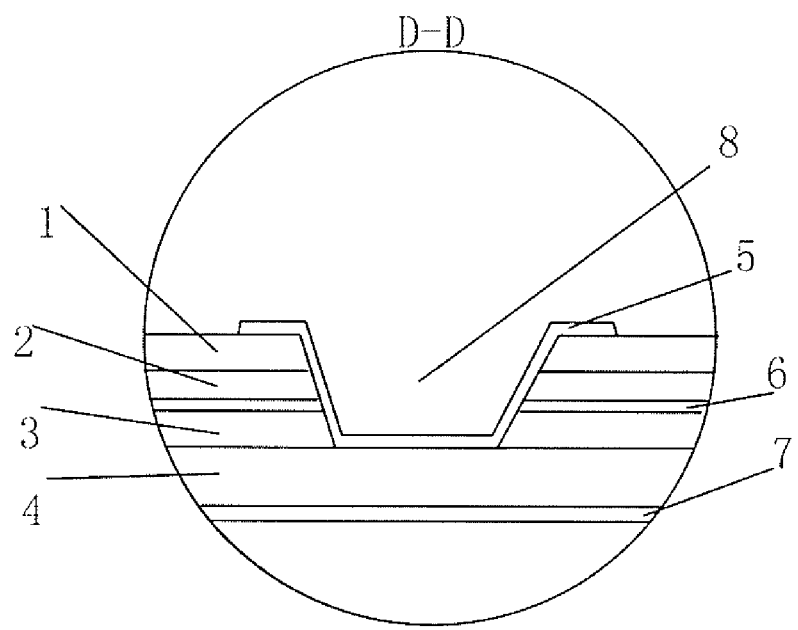
FIG. 6 is a sectional enlarged view taken along the line D-D in FIG. 3, which shows a second embodiment of the data line structure in the lead region of the TFT-LCD according to the invention.

As shown in FIGS. 3 and 6, the second embodiment is different from the first embodiment in that an active layer 6 is formed below the data line lead 2 and above the gate insulating layer 3. The portion of the active layer 6 in the position corresponding to the connection hole 8 is also removed. In this embodiment, the combination of the gate insulating layer 3 and the active layer is a dielectric layer interposed between the gate layer data line segment and the data line lead.

Figure 7:
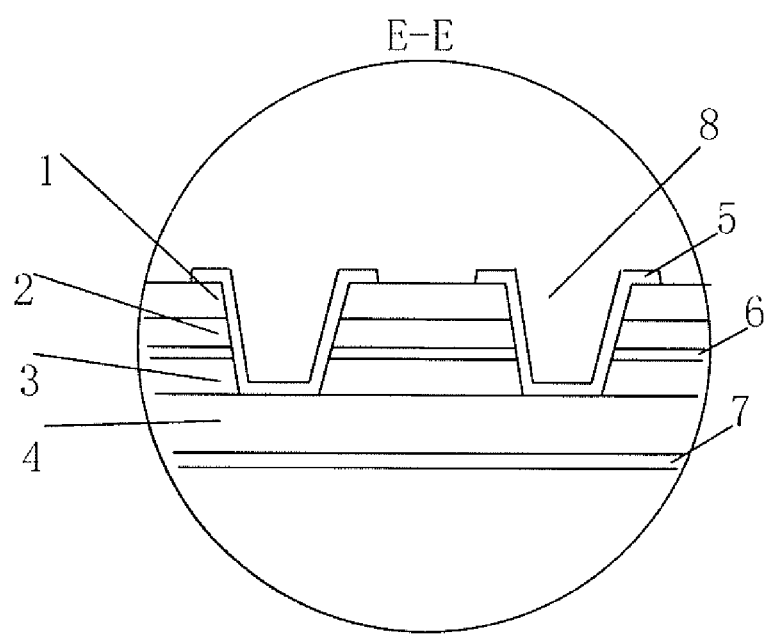
FIG. 7 is a sectional enlarged view taken along the line E-E in FIG. 3, which shows a second embodiment of the data line structure in the lead region of the TFT-LCD according to the invention.

FIG. 7 shows the sectional view taken along the line E-E in FIG. 3 of the lead region structure in the second embodiment. As viewed in the E-E direction, the lead region structure includes a plurality of via holes arranged separately in the data line lead, although only two via holes are shown in the Figure. There may be one or more via holes in the data line lead 2, and the via holes may be a truncation type via hole, the data line lead in the above embodiment may be in a segment configuration.

It can be seen, from the above two embodiments of the present invention, that a double layer connection structure with an upper data line lead and a lower gate layer data line segment is obtained by forming the data line segment in the gate layer. With the double layer connection structure, even the data line lead is open due to particles on the substrate before and during the source/drain metal layer deposition, electrostatic breakdown in the lead region and breakage due to press in a subsequent process, the whole lead can be prevented from being open. The double layer connection structure in the lead region can be realized without greatly changing the current process.

A third embodiment of a manufacturing method of the data line in a lead region of a TFT-LCD according to the invention is described below.

In the third embodiment, a five-mask process is adopted to form an array substrate of a TFT-LCD. In order to describe the invention in detail for better understanding, the embodiment is described in combination with the display region in the central portion of the array substrate. With reference to FIG. 8, the process may comprise following steps.

In step 51, a gate layer is formed on a substrate for example by deposition. A photoresist pattern is formed on the gate layer by exposing and developing. The gate layer is etched with the photoresist pattern as an etching mask to form a gate line and a gate electrode in the display region of the substrate and simultaneously a gate layer data line segment corresponding to a data line lead to be formed in a subsequent process in the peripheral lead region. That is, the gate layer is patterned.

In step 52, a gate insulating layer and an active layer are deposited subsequently on the substrate after step 51. By forming a photoresist pattern and using it as an etching mask, the active layer is patterned to form an active island for the thin film transistor in the display region of the substrate, and simultaneously the active layer in the peripheral lead region is removed by etching.

In step 53, a source/drain metal layer is formed on the substrate after step 52. By forming a photoresist pattern and using it as an etching mask, the source/drain metal layer is patterned to form a source and drain of a thin film transistor and a data line in the display region of the substrate, and simultaneously a data line lead is formed in the periphery lead region. Also, one or more via holes may be formed in the data line lead, and the shape of the via holes may be circle, rectangular, polygon, or the like.

In step 54, a passivation layer is formed on the substrate after step 53. By forming a photoresist pattern and using it as an etching mask to pattern the passivation layer, a though hole in the passivation layer above the drain is formed in the display region of the substrate, and simultaneously the portion of the passivation layer and the portion of the gate insulating layer at the position corresponding to the via hole in the data line lead is removed by etching so as to form a connection hole with the though hole in the data line lead.

In step 55, a pixel electrode layer is formed on the substrate after step 54. By forming a photoresist pattern and using it as an etching mask, the pixel electrode layer is patterned to form a pixel electrode in the display region of the substrate, which is connected to the drain through the through hole in the passivation layer, and simultaneously a connection line segment is formed in the connection hole in the periphery lead region. The connection line segment connects the gate layer data line segment and the data line lead exposed in the connection hole.

A fourth embodiment of the manufacturing method of the data line in a lead region of a TFT-LCD according to the invention is described below.

In the fourth embodiment, a four-mask process is adopted to form an array substrate of a TFT-LCD. Also, in order to describe the invention in detail for better understanding, the embodiment is described in combination with the display region in the central portion of the array substrate. The process of the fourth embodiment of the present invention is shown in FIG. 9.

In step 81, a gate layer is formed on a substrate. A photoresist pattern is formed on the gate layer by exposing and developing. The gate layer is etched with the photoresist pattern as an etching mask to form a gate line and a gate electrode in the display region of the substrate and simultaneously a gate layer data line segment corresponding to a data line lead to be formed in a subsequent process in the peripheral lead region. That is, the gate layer is patterned.

In step 82, a gate insulating layer, an active layer, and a source/drain metal layer are deposited subsequently on the substrate after step 81. By forming a photoresist pattern and using it as an etching mask, the stacked active layer and the source/drain metal layer and patterned to form a source and drain and an active island of a thin film transistor and a data line in the display region of the substrate, and simultaneously a data line lead is formed in the periphery lead region and above the gate layer data line segment. Also, one or more via holes may be formed in the data line lead, and the via hole may be in a shape of circle, rectangular, polygon, or the like. Furthermore, the active layer exposed with the via hole is removed by etching so as to expose the lower gate insulating layer. In this step, the formed photoresist pattern can be a half tone or a gray tone one.

In step 83, a passivation layer is formed on the substrate after step 82. By forming a photoresist pattern and using it as an etching mask to pattern the passivation layer, a through hole in the passivation layer above the drain is formed in the display region of the substrate, and simultaneously the portion of the passivation layer and the portion of the gate insulating layer at the position corresponding to the via hole in the data line lead is removed by etching so as to form a connection hole with the though hole in the data line lead.

In step 84, a pixel electrode layer is formed on the substrate after step 83. By forming a photoresist pattern and using it as an etching mask, the pixel electrode layer is patterned to form a pixel electrode in the display region of the substrate, which is connected to the drain through the through hole in the passivation layer, and simultaneously a connection line segment is formed in the connection hole in the periphery lead region. The connection line segment connects the gate layer data line segment and the data line lead exposed through the connection hole.

The fourth embodiment is different from the third embodiment in that the active layer is formed between the upper data line lead and the lower gate insulating layer, and the portion of the active layer at the position corresponding to the connection hole is removed.

With the above two manufacturing method embodiment of the lead region data line structure of a TFT-LCD, the double layer connection structure with the upper data line lead and the lower gate layer data line segment can be formed in the lead region.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A data line structure in a lead region of a thin film transistor liquid crystal display (TFT-LCD) comprising:
    a substrate;
    a gate layer data line segment in the lead region on the substrate;
    a dielectric layer on the gate layer data line segment in the lead region;
    a data line lead on the dielectric layer in the lead region, wherein the gate layer dataline segment extends corresponding to the data line lead;
    a passivation layer on the data line lead in the lead region;
    a via hole formed in the data line lead;
    a connection hole formed in a portion of the dielectric layer and a portion of the passivation layer in a position corresponding to the via hole and together with the via hole; and
    a connection line segment provided in the connection hole, wherein the gate layer data line segment and the data line lead are connected by the connection line segment in the connection hole.

2. The data line structure of claim 1, wherein the dielectric layer comprises a gate insulating layer.

3. The data line structure of claim 1, wherein the gate layer data line segment is provided right under the data line lead.

4. The data line structure of claim 1, wherein the via hole in the date line lead is in a shape selected from the group consisting of circle, rectangular, and polygon.

5. The data line structure of claim 1, wherein the dielectric layer comprises a gate insulating layer and an active layer formed on the gate insulating layer.

6. The data line structure claim 5, wherein the gate layer data line segment is provided right under the data line lead.

7. The data line structure of claim 5, wherein the via hole in the date line lead is in a shape selected from the group consisting of circle, rectangular, and polygon.

8. The data line structure of claim 1, wherein the connection line segment is formed of a material the same as that of a pixel electrode of the TFT-LCD.

\* \* \* \* \*